United States Patent [19]

Landreth et al.

[11] Patent Number: 5,045,128

[45] Date of Patent: Sep. 3, 1991

[54] SOLDER FLUXES BEARING OXIDE REMOVERS GENERATED BY LIGHT

[75] Inventors: Bobby D. Landreth, Ft. Lauderdale; Robert W. Pennisi, Boca Raton; James L. Davis, Tamarac; Fadia Nounou, Plantation, all of Fla.

[73] Assignee: Motorola, Inc., Schaumburg, Ill.

[21] Appl. No.: 566,029

[22] Filed: Aug. 13, 1990

[51] Int. Cl.$^5$ .............................................. B23K 35/34
[52] U.S. Cl. ...................................................... 148/23
[58] Field of Search ........................ 148/23; 252/501.1

[56] References Cited

U.S. PATENT DOCUMENTS 2,758,940  8/1956  Baker ................................ 252/501.1

OTHER PUBLICATIONS

WPI Abstract 83-38150K/16 or JP 58042651 Document, Week 83-16, 1983.

Primary Examiner—Peter D. Rosenberg
Attorney, Agent, or Firm—Daniel K. Nichols

[57] ABSTRACT

Fluxing compositions containing compounds that generate acids upon photoinitiation from a light source such as Hg/Xe ultraviolet (UV) light sources are described. The acids clean oxides from the printed circuit boards (PCBs) under assembly and then volatilize with little or no need for a cleaning step, or cleaning only with water. The compounds that release an oxide removing agent, sometimes called a "photoacid" include metal and organic onium salts and furyl compounds bearing a carbonyl group. Such fluxing compositions can be used mixed with typical solder formulations, such as lead/tin solders, or applied topically thereto; both techniques permit the assembly of PCBs more easily and with high quality bonds.

46 Claims, No Drawings

SOLDER FLUXES BEARING OXIDE REMOVERS GENERATED BY LIGHT

FIELD OF THE INVENTION

The invention relates to solder flux formulations, and in one aspect, more particularly relates to solder flux formulations incorporating materials that react during soldering to produce useful volatile compounds.

BACKGROUND OF THE INVENTION

Solder formulations, also known as solder creams or solder pastes, are homogeneous blends of a soft solder alloy typically in a powder form dispersed in a liquid medium conventionally containing a fluxing composition or flux, an organic solvent, and a thickening agent which will give the desired viscous or paste-like consistency to the solder formulation. Such solder formulations can be applied to the surfaces or locations requiring soldering in a number of various ways, such as by screen printing, or by means of a dispenser such as a syringe, or simply by dipping the site to be soldered into the solder paste formulation so that the viscous paste adheres to the site, such as an electronic component lead.

Recently, solder paste formulations have been used increasingly by the electronics industry, particularly in the automated manufacture of printed circuits in which leadless miniature electronic components are surface mounted on a printed circuit board (PCB) to which a solder pate formulation has previously been applied, such as by screen printing. The PCB is then subjected to a sufficiently high temperature, for example by means of a heated conveyor belt, to cause the flux and solder alloy in the formulation to liquefy and contact the electronic component leads so that on subsequent cooling of the PCB, the components will remain soldered in situ on the PCB.

For some uses in the electronics industry, it is desirable to use as the flux composition of the solder formulation a material which is non-corrosive and which will provide, after the heating and cooling steps, flux residues which are themselves non-corrosive and non-conducting. For this reason, rosin-based flux compositions are widely used in the commercially available solder pate formulations specifically made for use in the manufacture of surface mounted electronic components.

Alternatively, more reactive fluxing compositions may be used, which leave residues which are corrosive and/or conductive. Often a somewhat corrosive fluxing composition is desired so that the oxides which form on the metal surfaces may be removed to permit the subsequently formed solder bond to be stronger both physically and electrically. However, it is necessary to remove the residues formed by means of ether aqueous or organic solvent systems to ensure that the resulting soldered circuit is non-corrosive.

The use of the solder paste formulations containing such rosin-based or more reactive fluxes produces a number of disadvantages. First, because non-corrosive residues tend to be sticky, they prevent repetitive automatic testing of the circuit. Additionally, such residues are unsightly and therefor, as with the corrosive flux residues which are also unattractive, will need to be removed. The removal step involves extra production equipment, time and material.

Secondly, flux residues tend to be hygroscopic and may thereby cause spattering. Thirdly, some fluxes permit solder particles in the paste to move away from the solder site and give rise to the formation of numbers of discrete small balls of soft solder around the soldered joints, which can create electrical short circuits.

Because of these and other disadvantages, it is desirable and often essential to meet specifications, to remove the flux residues and any solder balls as much as possible. Often, however, their removal is difficult or impossible, particularly from areas of the PCB underneath the electronic components.

As noted, a common procedure is to use an aqueous or organic solvent in the removal of flux residues. Though water is preferred because it will not leave an objectionable residue itself, water typically is an ineffective agent, since many of the residues are only slightly soluble in water. Organic solvents are more effective, but less desirable because they are more expensive and particularly because they are more troublesome to dispose of. A particular class or organic solvents that had attained widespread use was the halocarbons, such as the chlorofluorocarbons (CFCs), because they would volatilize after cleaning. However, these materials are particularly inert and their eventual decomposition is suspected to be involved in the undesirable depletion of atmospheric ozone.

Thus, for these and other reasons the prior solder fluxing compositions are less preferred, and it would therefore be advantageous to discover a new fluxing composition that would avoid one or more of these disadvantages.

SUMMARY OF THE INVENTION

Accordingly, it is an object of the present invention to provide a solder fluxing composition that would easily and controllably generate an oxide removing agent during the soldering process.

It is another object of the present invention to provide a novel fluxing agent which generates an oxide removing agent that would either readily volatilize or be readily removed with water.

It is yet another object of the invention to provide a fluxing composition that would have little or no environmental concerns.

In carrying out these and other objects of the invention, there is provided, in one form, a fluxing composition for a solder formulation, which fluxing composition has a compound that will release an oxide removing agent upon exposure of the compound to light.

DETAILED DESCRIPTION OF THE INVENTION

It has been discovered that an excellent fluxing composition may be provided by incorporating a compound that will release or generate an oxide removing agent upon exposure to light or a combination of light and heat. It has also been discovered that there are a number of ways to implement this concept. The oxide removing agent may be an acid, but specifically a photoacid, that is, one which is generated or produced by a particular compound upon exposure to light or light and heat.

Onium salts are compounds which may be incorporated into solder flux compositions to allow the photoinitiation of acid production. As noted, the acid formed acts to remove oxides which would otherwise prevent efficient solder reflow operations. The onium salt is a cation/anion pair. Cations which are suitable for onium salts include, but are not limited to, aryldiazonium (ArN$_2$+), diaryliodinium (Ar$_2$I+), triarylsulfonium (Ar$_3$S+), diarylalkylsulfonium (Ar$_2$RS+), phenarylsulfonium, etc. and mixtures thereof, where Ar is an aryl group. The anion is selected from the group including, but not limited to tetrafluoroborate (BF$_4$−), hexafluorophosphate (PF$_6$−), hexafluoroarsenate (AsF$_6$−), hexafluoroantimonate (SbF$_6$−), etc. and mixtures thereof.

The salts produced by the cation/anion pairs of this list produce acids of the form HX, where X is any of the listed anions when exposed to light, particularly ultraviolet light. Heat may also be required for some compounds, but not necessary for others. Of course, the compounds will be heated during the soldering step. Non-metallic onium salts and non-ionic photoacid generators are also expected to useful. Such materials include, but are not limited to certain halogenated hydrocarbons and aromatics, including, but not limited to: o-nitrobenzyl alcohol sulfonates, oxime sulfonates, naphthoquinonediazide-4-sulfonates, trichloromethyl-substituted s-triazines, o,o'-dihalogenated phenols, dinitrobenzylesters, etc., and mixtures thereof. Organic polymeric materials may also be useful.

Compounds that undergo photodegradation are the furyl compounds which contain a carbonyl group. Such compounds may have the structure:

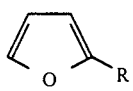

where R is a substituent which contains a carbonyl group, for example the moieties —COOH or —CH=CH—COOH. Particular furyl compounds include, but are not limited to 2-furoic acid, furylacrylic acid, furoylacrolein, furylacetate, furylacetophenone, furylacetic acid, furylbenzoic acid, furylcarboxylic acid, furylglyoxylic acid, etc., and mixtures thereof. In this case the active compounds are the furyl compounds shown above and the compound is broken down by light into lower molecular weight components that readily volatilize after they clean oxides form the PCB. Typically, the decomposition products are furan and a low molecular weight acid, and may also include carbon monoxide or carbon dioxide. In other words, photovolatilization of solder flux components prevents the formation of fluxing composition residues when used with non-crosslinking chemistries that would otherwise react with the compound fragments. This volatilization again reduces or precludes the need for any board cleaning with ozone-depleting CFCs after solder reflow. Ultraviolet radiation-initiated Norrish cleavage reactions at elevated temperatures (such as those encountered during solder reflow) break down the residue forming solder flux components which clean the board and then volatilize, leaving a board with very little or no residue.

Although the system could be designed to respond to any specific wavelength range, a particularly useful region is the ultraviolet (UV). This specific wavelength range permits the photoinitiation to be controlled so that it cannot occur too early or late. Additionally, UV light sources are readily available.

With any of these compounds and methods of this invention, retooling would simply involve the installation of a UV transparent window and a UV exposure tool in the existing assembly line. While some benefit may be obtained form exposing the solder formulation to UV light before and/or after soldering, it is expected that the greatest benefit will be achieved by simply blanketing the assembly with UV light during the solder reflow operation. If some residue does remain with certain of these systems, it will further be appreciated that they will be relatively low molecular weight systems and in most, if not all cases, may be washed away with water. In the case of the metal onium salts, some metals may be entrained in the water, which metals may have to be removed. Depending on the exact organic fragments from the non-metallic compounds, water to rinse them may need to be treated as well. Nevertheless, these concerns are appreciably less than those presented by the CFC agents.

In one aspect, the proportion of oxide remover generating compound should be at least 1 wt. % of the overall fluxing composition. It is preferred that the compound proportion be at least 3 wt. % It will be appreciated that the proportion of compound as a proportion of the overall solder formulation will vary depending on the particular formulation. The balance of the fluxing composition may be any of the customary materials, for example, propylene carbonate may be used as a carrier material. It will be appreciated that although the other common materials, such as the rosins, may be used in conjunction with the compounds of the invention, that some of these typical materials contribute to flux residues and should not be employed to take full advantage of the little or no residues provided by the flux compositions of the present invention.

While the fluxing compositions described herein may be integrally mixed with the solder powder, such as a lead/tin powder, solvent and thickener in a conventional manner, it has also been discovered that the fluxing compositions may also be effective simply by being coated over the solder surfaces prior to reflow.

The fluxing compositions of the present invention may also include an ultraviolet sensitizer. Specifically preferred are ultraviolet triplet sensitizers. These triplet photosensitizers are used to shift the optimum wavelength for UV radiation into the region supplied by most common Hg—Xe exposure sources. These are compounds which readily absorb UV energy to excite their electron pairs from the singlet electronic state to the triplet electronic state. As the pairs go back to the singlet state energy is discharged to the compounds causing them to cleave and release the oxide cleaning agents. The triplet photosensitizers are specific molecules that help the fluxing compositions absorb UV energy and transmit it to the compounds for use. The sensitizers are selected based on optimum triplet excited state lifetimes and intersystem crossing efficiencies. Some seemingly related compounds release energy too fast or in an usuable form and are thus unsuitable.

Acceptable triplet photosensitizers include, but are not limited to acetophenone, benzophenone, Michler's ketone (tetramethyldiaminobenzophenone), triphenylene, naphthalene, derivatives of acetophenone, 2-phenylacetophenone and its derivatives, ketocoumarins, thioxanthones, and the like, and mixtures thereof. Solder flux compositions utilizing the acetophenone triplet sensitizer were found to be particularly effective as triplet energy transfer agents in solder paste formulations. The proportion of sensitizer in the fluxing compositions should be about 30 wt. % of less, for example, from 0.1 to about 30 wt. %, and in one aspect from about 3 to about 10 wt. %.

The invention will be described in more detail with respect to the following illustrative examples.

noticed when UV light was used, as compared with Example 11 when no UV assistance was employed.

TABLE II

| | | Use of Furyl Compounds as Photoacid Generators | | | | |
|---|---|---|---|---|---|---|
| Ex. | Solvent | Photoacid releasing compound | Solvent amount. mg. | OS or furyl compound amount. mg. | OS or furyl compound wt. % | Residue Comparison with control |
| 11 | propylene carbonate | $(C_6H_5)_3S^+/$ $AsF_6^-$ | 1123.4 | 36.4 | ~3 | Less residue than Ex. 15 |
| 12 | propylene carbonate | 2-furoic acid | 1414.1 | 44.0 | ~3 | Less residue than Ex. 11 |
| 13 | propylene carbonate | 2-furoic aicd | 1414.1 | 102.9 | ~7 | Less residue than Ex. 11 |
| 14 | propylene carbonate | furylacrylic acid | 1365.9 | 47.2 | ~3 | Less residue than Ex. 11 |
| 15[1] | propylene carbonate | furylacrylic acid | 1365.9 | 47.2 | ~3 | Residue |

[1] No UV assistance.

EXAMPLE 1-11

Use of Onium Salts as Photoacid Generators

Fluxing compositions having the indicated compositions in Table 1 were prepared and reflowed at 230° C. Other components were used as solvents, and they are noted. The onion salt system for all Examples, except Examples 5, 9 and 10, was $(C_6H_5)_3S+/AsF_6-$. Comparative Examples 5, 9 and 10 used no onium salt. The amount of residue for each example is indicated. In each of these Examples, UV light was present during and preceding the reflow. When no UV light was used for these same materials, considerably more residue was noted, if reflow occurred at all. The relative notations for residue are based on the maximum residue observed when acid content was insufficient to promote reflow. It may be seen that the formulations of Examples 4 and 7 using the onium salt gave appreciably less residue.

TABLE I

| | | | Use of Onium Salts as Photoacid Generators | | | | |
|---|---|---|---|---|---|---|---|
| Ex. | First component | Second component, if any | First component amount. mg. | Second component amount. mg. | Onium salt amount. mg. | OS[1] wt. % | Residue Comparison with control |
| 1 | propylene carbonate | | 394.7 | | 11.72 | ~3 | Residue |
| 2 | propylene carbonate | | 6335.58 | | 9.11 | ~0.15 | No reflow |
| 3 | propylene carbonate | | 2210.35 | | 22.39 | ~1.0 | No reflow |
| 4 | propylene carbonate | 2-propanol | 150.2 | 584.23 | 10.99 | ~1.5 | Less residue |
| 5 | propylene carbonate | DQ[2] | 714.26 | 21.56 | — | — | Residue |
| 6 | 2-propanol | | 909.21 | | 18.46 | ~2 | No reflow |
| 7 | propylene carbonate | NBA[3] | 42.19 | 332.46 | 10.35 | ~3 | Less residue |
| 8 | EA[4] | | 648.29 | | 19.72 | ~3 | Residue |
| 9 | EA | AA[5] | 1270.28 | 39.40 | — | — | Residue |
| 10 | EA | PF[6] | 1838.07 | 56.93 | — | — | Exploded |

[1] OS = onium salt.
[2] DQ = diazoquinone
[3] nBA = n-butyl acetate
[4] EA = ethyl acetate
[5] AA = acrylic acid
[6] PF = para-formaldeyde

EXAMPLES 11-15

Use of Furyl Compounds as Photoacid Generators

These Examples were conducted similarly to Examples 1-10 with the indicated results. Surprisingly, in the case of the furyl compounds, little or nor residue was

EXAMPLE 16

Use of Acetophenone as Triplet Photosensitizer

A copper tape was dipped in malic acid and then rinsed in deionized (DI) water. A fluxing composition of 619.4 mg. ethylene carbonate (265.2+344.2), 267.6 mg. acetophenone and 35 mg. furylacrylic acid. The proportions in this composition were 67 wt. % ethylene carbonate, 29 wt. % acetophenone and 4 wt. % furylacrylic acid. Three solder balls were placed on the tape and coated with the fluxing composition. A 50 sec. reflow of this material at 245° C. on the tape which included a 40 sec. UV treatment produced bonded solder balls with extremely little residue, even before washing. Thus, this experiment indicates that the triplet photosensitizers can materially help transfer energy to make the photoinitiated acid production more effective, and also that the fluxing compositions may be added topically to the solder as an alternative to being integrally mixed therewith.

It will be appreciated that modifications may be made in the exact implementation of the invention illustrated in the above examples which would still fall within the spirit and scope of the invention as claimed herein. For example, it is anticipated that the processing conditions, modes or sequences of addition of the fluxing compositions, and exact combinations of flux components may be altered to optimize the invention by one skilled in the art. It is also expected that the method of this invention could be used to assemble PCBs, including ones bearing surface mount devices, more economically by potentially eliminating a cleaning step, but without the use of CFCs.

We claim:

1. A fluxing composition for a solder formulation comprising a compound that will release a reducing agent upon exposure to light.

2. The fluxing composition of claim 1 wherein the compound is present in the fluxing composition in a proportion of at least 1 wt. %.

3. The fluxing composition of claim 1 wherein the compound is an onium salt.

4. The fluxing composition of claim 3 wherein the onium salt is selected from the group comprising a non-metallic organic onium salt and a non-ionic photoacid generator.

5. The fluxing composition of claim 4 wherein the onium salt is a combination of a cation and an anion, where the cation is selected from the group consisting of aryldiazonium ($ArN_2+$), diaryliodinium ($Ar_2I+$), triarylsulfonium ($Ar_3S+$), diarylalkylsulfonium ($Ar_2RS+$), phenarylsulfonium and mixtures thereof, where Ar is an aryl group and R is an alkyl group; and the anion is selected from the group consisting of tetrafluoroborate ($BF_4-$), hexafluorophosphate ($PF_6-$), hexafluoroarsenate ($AsF_6-$), hexafluoroantimonte ($SbF_6-$) and mixtures thereof; and the non-ionic photoacid generator is selected from the group consisting of o-nitrobenzyl alcohol sulfonates, oxime sulfonates, naphthoquinonediazide-4-sulfonates, trichloromethyl-substituted s-triazines, o,o'-dihalogenated phenols, dinitrobenzylesters, etc., and mixtures thereof.

6. The fluxing composition of claim 1 wherein the compound is a furyl compound containing a carbonyl group.

7. The fluxing composition of claim 6 where the furyl compound is selected from the group consisting of 2-furoic acid, furylacrylic acid, furoylacrolein, furylacetate, furylacetophenone, furylacetic acid, furylbenzoic acid, furylcarboxylic acid, furylglyoxylic acid, and mixtures thereof.

8. The fluxing composition of claim 1 where the compound releases the oxide removing agent upon exposure to ultraviolet light.

9. The fluxing composition of claim 8 additionally comprising an ultraviolet sensitizer.

10. The fluxing composition of claim 8 where the ultraviolet sensitizer is selected from the group consisting of acetophenone, benzophenone, Michler's ketone (tetramethyldiaminobenzophenone), triphenylene, naphthalene, derivatives of acetophenone, 2-phenylacetophenone and its derivatives, ketocoumarins, thioxantones, and mixtures thereof.

11. The fluxing composition of claim 8 where the ultraviolet sensitizer is present in the fluxing composition in an amount of about 30 wt. % or less.

12. A solder formulation comprising:

a fluxing composition comprising a compound that will release an oxide removing agent upon exposure to light, where the compound is present in the fluxing composition in a proportion of at least 1 wt. %; and a lead/tin solder powder.

13. The solder formulation of claim 12 wherein the fluxing composition compound is an onium salt.

14. The solder formulation of claim 13 where the onium salt is selected from the group comprising a non-metallic organic onium salt and a non-ionic photoacid generator.

15. The solder formulation of claim 14 where the onium salt is a combination of a cation and an anion, where the cation is selected from the group consisting of aryldiazonium ($ArN_2+$), diaryliodinium ($Ar_2I+$), triarylsulfonium ($Ar_3S+$), diarylalkylsulfonium ($Ar_2RS+$), phenarylsulfonium and mixtures thereof, where Ar is an aryl group and R is an alkyl group; and the anion is selected from the group consisting of tetrafluoroborate ($BF_4-$), hexafluorophosphate ($PF_6-$), hexafluoroarsenate ($AsF_6-$), hexafluoroantimonate ($SbF_6-$) and mixtures thereof; and the non-ionic photoacid generator is selected from the group consisting of o-nitrobenzyl alcohol sulfonates, oxime sulfonates, naphthoquinonediazide-4-sulfonates, trichloromethyl-substituted s-triazines, o, o'-dihalogenated phenols, dinitrobenzylesters, etc., and mixtures thereof.

16. The solder formulation of claim 12 wherein the compound is a furyl compound containing a carbonyl group.

17. The solder formulation of claim 16 where the furyl compound is selected from the group consisting of 2-furoic acid, furylacrylic acid, furoylacrolein, furylacetate, furylacetophenone, furylacetic acid, furylbenzoic acid, furylcarboxylic acid, furylglyoxylic acid, and mixtures thereof.

18. The solder formulation of claim 12 where the compound releases the oxide removing agent upon exposure to ultraviolet light.

19. The solder formulation of claim 18 additionally comprising an ultraviolet sensitizer.

20. The solder formulation of claim 18 wherein the ultraviolet sensitizer is selected from the group consisting of acetophenone, benzophenone, Michler's ketone (tetramethyldiaminobenzophenone), triphenylene, naphthalene, derivatives of acetophenone, 2-phenylacetophenone and its derivatives, ketocoumarins, thioxantones, and mixtures thereof.

21. The solder formulation of claim 18 wherein the ultraviolet sensitizer is present in the fluxing composition in an amount of about 30 wt. % or less.

22. A fluxing composition for a solder formulation comprising an onium salt compound that will release an oxide removing agent upon exposure to light, where the onium salt is present in a proportion of at least 1 wt. %.

23. The fluxing composition of claim 22 wherein the onium salt is selected from the group comprising a non-metallic organic onium salt and a non-ionic photoacid generator.

24. The fluxing composition of claim 23 wherein the onium salt is a combination of a cation and an anion, where the cation is selected from the group consisting of aryldiazonium ($ArN_2+$), diaryliodinium ($Ar_2I+$), triarylsulfonium ($Ar_3S+$), diarylaklylsulfonium ($Ar_2RS+$), phenarylsulfonium and mixtures thereof, where Ar is an aryl group and R is an alkyl group; and the anion is selected from the group consisting of tetrafluoroborate ($BF_4-$), hexafluorophosphate ($PF_6-$), hexafluoroarsenate ($AsF_6-$), hexafluoroantimonate ($SbF_6-$) and mixtures thereof; and the non-ionic photoacid generator is selected from the group consisting of o-nitrobenzyl alcohol sulfonates, oxime sulfonates, naphthoquinonediazide-4-sulfonates, trichloromethyl-substituted s-triazines, o,o'-dihalogenated phenols, dinitrobenzylesters, etc., and mixtures thereof.

25. The fluxing composition of claim 22 wherein the onium salt releases the oxide removing agent upon exposure to ultraviolet light.

26. The fluxing composition of claim 22 additionally comprising an ultraviolet sensitizer.

27. The fluxing composition of claim 26 where the ultraviolet sensitizer is selected from the group consisting of acetophenone, benzophenone, Michler's ketone (tetramethyldiaminobenzophenone), triphenylene, naphthalene, derivatives of acetophenone, 2-phenylacetophenone and its derivatives, ketocoumarins, thioxanthones, and mixtures thereof, and where the ultraviolet sensitizer is present in the fluxing composition in an amount of about 30 wt. % or less.

28. A fluxing composition for a solder formulation comprising a furyl compound containing a carbonyl group that will release an oxide removing agent upon exposure to light, where the furyl compound is present in the fluxing composition in a proportion of at least 1 wt. %.

29. The fluxing composition of claim 28 wherein the furyl compound is selected from the group consisting of 2-furoic acid, furylacrylic acid, furoylacrolein, furylacetate, furylacetophenone, furylacetic acid, furylbenzoic acid, furylcarboxylic acid, furylglyoxylic acid, and mixtures thereof.

30. The fluxing composition of claim 18 where the furyl compound releases the oxide removing agent upon exposure to ultraviolet light.

31. The fluxing composition of claim 28 additionally comprising an ultraviolet sensitizer.

32. The fluxing composition of claim 31 wherein the ultraviolet sensitizer is selected from the group consisting of acetophenone, benzophenone, Michler's ketone (tetramethyldiaminobenzophenone), triphenylene, naphthalene, derivatives of acetophenone, 2-phenylacetophenone and its derivatives, ketocoumarins, thioxanthones, and mixtures thereof, and where the ultraviolet sensitizer is present in the fluxing composition in an amount of about 30 wt. % or less.

33. A fluxing composition for a solder formulation comprising
    a compound that will release an oxide removing agent upon exposure to ultraviolet light; and
    an ultraviolet sensitizer.

34. The fluxing composition of claim 33 wherein the ultraviolet sensitizer is selected from the group consisting of acetophenone, benzophenone, Michler's ketone (tetramethyldiaminobenzophenone), triphenylene, naphthalene, derivatives of acetophenone, 2-phenylacetophenone and its derivatives, ketocoumarins, thioxanthones, and mixtures thereof.

35. The fluxing composition of claim 33 where the ultraviolet sensitizer is present in the fluxing composition in an amount of about 30 wt. % or less.

36. A method for soldering at least two metals together comprising the following steps in an effective sequence:
    bringing the metals to be soldered into proximity;
    applying a solder formulation to at least one of the metals, where the solder formulation comprises:
        a fluxing composition comprising a compound that will release an oxide removing agent upon exposure to light, where the compound is present in the fluxing composition in a proportion of at least 1 wt. %; and
        a lead/tin solder powder;
    exposing the solder formulation to light to release the oxide removing agent; and
    causing the solder formulation to flow and contact the metals and form a solder bond.

37. The method of claim 36 where in the fluxing composition, the compound is an onium salt.

38. The method of claim 37 where the onium salt is selected from the group comprising a non-metallic organic onium salt or non-ionic photoacid generator.

39. The method of claim 38 wherein the onium salt is a combination of a cation and an anion, where the cation is selected from the group consisting of aryldiazonium ($ArN_2+$), diaryliodinium ($Ar_2I+$), triarylsulfonium ($Ar_3S+$), diarylalkylsulfonium ($Ar_2RS+$), phenarylsulfonium and mixtures thereof, where Ar is an aryl group and R is an alkyl group; and the anion is selected from the group consisting of tetrafluoroborate ($BF_4-$), hexafluorophosphate ($PF_6-$), hexafluoroarsenate ($AsF_6-$), hexafluoroantimonate ($SbF_6-$) and mixtures thereof; and the non-ionic photoacid generator is selected from the group consisting of o-nitrobenzyl alcohol sulfonates, oxime sulfonates, naphthoquinonediazide-4-sulfonates, trichloromethyl-substituted s-triazines, o,o'-dihalogenated phenols, dinitrobenzylesters, etc., and mixtures thereof.

40. The method of claim 36 wherein the fluxing composition, the compound is a furyl compound containing a carbonyl group.

41. The method of claim 40 where the furyl compound is selected from the group consisting of 2-furoic acid, furylacrylic acid, furoylacrolein, furylacetate, furylacetophenone, furylacetic acid, furylbenzoic acid, furylcarboxylic acid, furylglyoxylic acid, and mixtures thereof.

42. The method of claim 36 where the compound releases the oxide removing agent upon exposure to ultraviolet light.

43. The method of claim 42, where the fluxing composition additionally comprising an ultraviolet sensitizer.

44. The method of claim 43 where the ultraviolet sensitizer is selected from the group consisting of acetophenone, benzophenone, Michler's ketone (tetramethyldiaminobenzophenone), triphenylene, naphthalene, derivatives of acetophenone, 2-phenylacetophenone and its derivatives, ketocoumarins, thioxanthones, and mixtures thereof.

45. The method of claim 43 where the ultraviolet sensitizer is present in the fluxing composition in an amount of about 30 wt. % or less.

46. The method of claim 36 in the absence of cleaning steps of the metals or the solder bond by halocarbons.

* * * * *

UNITED STATES PATENT AND TRADEMARK OFFICE
CERTIFICATE OF CORRECTION

PATENT NO. : 5,045,128
DATED : Sept 3, 1991
INVENTOR(S) : Landreth, et al It is certified that error appears in the above-identified patent and that said Letters Patent is hereby corrected as shown below:

Column 7, line 34, delete "hexafluoroantimonte" and insert therefor -- hexafluoroantimonate --.

Column 8, line 63, delete "diarylaklylsulfonium" and insert therefor -- diarylalkylsulfonium --.

Column 9, line 35, delete "18" and insert therefor -- 28 --.

Signed and Sealed this

Twenty-sixth Day of July, 1994

Attest:

BRUCE LEHMAN

*Attesting Officer*          *Commissioner of Patents and Trademarks*

UNITED STATES PATENT AND TRADEMARK OFFICE
CERTIFICATE OF CORRECTION

PATENT NO. : 5,045,128
DATED : September 3, 1991
INVENTOR(S) : Landreth, et al

It is certified that error appears in the above-indentified patent and that said Letters Patent is hereby corrected as shown below:

Column 7, line 51, delete "oxide removing" and insert therefor --reducing--.

Signed and Sealed this

Seventh Day of March, 1995

*Attest:*

BRUCE LEHMAN

*Attesting Officer*  *Commissioner of Patents and Trademarks*